United States Patent
Chiu et al.

(10) Patent No.: US 10,629,646 B2
(45) Date of Patent: Apr. 21, 2020

(54) IMAGE SENSOR INCLUDING DOPED REGIONS AND MANUFACTURING METHOD THEREFOR

(71) Applicants: Semiconductor Manufacturing International (Shanghai) Corporation, Shanghai (CN); Semiconductor Manufacturing International (Beijing) Corporation, Beijing (CN)

(72) Inventors: Tzu Yin Chiu, Shanghai (CN); Chong Wang, Shanghai (CN); Haifang Zhang, Shanghai (CN); Xuanjie Liu, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 15/820,534

(22) Filed: Nov. 22, 2017

(65) Prior Publication Data
US 2018/0175098 A1 Jun. 21, 2018

(30) Foreign Application Priority Data
Dec. 20, 2016 (CN) .......................... 2016 1 1180910

(51) Int. Cl.
*H01L 27/14* (2006.01)
*H01L 27/146* (2006.01)

(52) U.S. Cl.
CPC .. *H01L 27/14683* (2013.01); *H01L 27/14636* (2013.01); *H01L 27/14643* (2013.01); *H01L 27/14689* (2013.01)

(58) Field of Classification Search
CPC ......... H01L 27/14643; H01L 27/14683; H01L 27/14636; H01L 27/14689
(Continued)

(56) References Cited

U.S. PATENT DOCUMENTS 6,159,839 A 12/2000 Jeng et al.
6,326,652 B1 12/2001 Rhodes
(Continued)

OTHER PUBLICATIONS

Extended European Search Report dated May 15, 2018 for EP Application No. 17 20 6874.4 (9 pp.).

*Primary Examiner* — Didarul A Mazumder
(74) *Attorney, Agent, or Firm* — Brinks Gilson & Lione

(57) ABSTRACT

The present disclosure relates to the technical field of semiconductors, and discloses an image sensor and a manufacturing method therefor. The method includes: providing a semiconductor structure, where the semiconductor structure includes: a semiconductor substrate, and a first active region located on the semiconductor substrate, the first active region including a first doped region and a second doped region abutting against the first doped region, and the second doped region being located at an upper surface of the first active region; forming a semiconductor layer on an upper surface of the second doped region; and forming a contact connected to the semiconductor layer. The present disclosure enables defects or damages caused when forming the contact to be kept away from a junction field formed by the second doped region and the first doped region. Therefore, leakage current may be reduced and device performances may be improved.

14 Claims, 8 Drawing Sheets

(58) Field of Classification Search
USPC .......................................... 257/461; 438/48
See application file for complete search history.

(56) References Cited

U.S. PATENT DOCUMENTS

| | | | |
|---|---|---|---|
| 9,190,272 B1 | 11/2015 | Park et al. | |
| 2003/0203546 A1* | 10/2003 | Burbach | H01L 21/743 438/151 |
| 2004/0251482 A1 | 12/2004 | Rhodes | |
| 2006/0043436 A1 | 3/2006 | Fan et al. | |
| 2007/0023802 A1* | 2/2007 | Oh | H01L 27/14609 257/292 |
| 2010/0244130 A1* | 9/2010 | Bulucea | H01L 21/26513 257/336 |
| 2011/0242390 A1* | 10/2011 | Sogoh | H01L 27/14609 348/311 |
| 2015/0076500 A1* | 3/2015 | Sakaida | H01L 27/14612 257/59 |
| 2017/0345836 A1* | 11/2017 | La Rosa | H01L 29/788 |
| 2018/0012992 A1* | 1/2018 | Lee | H01L 29/1083 |

\* cited by examiner

IMAGE SENSOR INCLUDING DOPED REGIONS AND MANUFACTURING METHOD THEREFOR

RELATED APPLICATION

The present application claims priority to Chinese Patent Application. No. 201611180910.8, filed Dec. 20, 2016, the entirety of which is hereby incorporated by reference.

BACKGROUND

Technical Field

The present disclosure relates to the technical field of semiconductors, and in particular, to an image sensor and a manufacturing method therefor.

Related Art

FIG. 1A is a circuit connection diagram that schematically illustrates a CIS (Contact Image Sensor) in the prior art. As shown in FIG. 1A, the CIS includes a photodiode 101 and four transistors. The four transistors are a first transistor 102, a second transistor 103, a third transistor 104, and a fourth transistor 105, separately. A floating diffusion (FD for short) region is provided between the first transistor 102 and the second transistor 103. Photons of the photodiode 101 are stored at the FD after being converted into electric charges, where the FD herein serves as a capacitor for storing electric charges.

FIG. 1B is a top view that schematically illustrates a part of a circuit structure of a CIS. FIG. 1B shows an active region 111, the photodiode 101, the first transistor 102, the FD, the second transistor 103, and a metal contact 110. FIG. 1C is a schematic sectional diagram that schematically illustrates a structure in FIG. 1B that is intercepted along a line A-A'. FIG. 1C shows the first transistor 102, the second transistor 103, and the metal contact 110. In addition, FIG. 1C further shows a P-type well region 122, an N-type doped region 121, and a depletion region 123, where these regions form a part of the FD. At present, a situation of leakage current would easily occur to the FD.

SUMMARY

The foregoing prior art has problems, and the present disclosure provides a new technical solution regarding at least one of the foregoing problems.

In one aspect of the present disclosure, a method for manufacturing an image sensor is provided, including: providing a semiconductor structure, where the semiconductor structure includes: a semiconductor substrate, and a first active region located on the semiconductor substrate, the first active region including a first doped region and a second doped region abutting against the first active region, and the second doped region being located at an upper surface of the first active region; forming a semiconductor layer on an upper surface of the second doped region; and forming a contact connected to the semiconductor layer.

In some implementations, the semiconductor layer is a doped semiconductor layer.

In some implementations, a conductivity type of the semiconductor layer is the same as a conductivity type of the second doped region.

In some implementations, material of the semiconductor layer includes polysilicon.

In some implementations, the method further includes, before forming the semiconductor layer, forming a patterned protection layer on the semiconductor structure, the protection layer exposing the upper surface of the second doped region.

In some implementations, the method further includes, after the semiconductor layer is formed and before the contact is formed, removing the protection layer.

In some implementations, material of the protection layer includes at least one of an oxide of silicon or a nitride of silicon.

In some implementations, forming a semiconductor layer on an upper surface of the second doped region includes: forming the semiconductor layer on the semiconductor structure; and etching the semiconductor layer to remove a part of the semiconductor layer, while retaining a part of the semiconductor layer which is on the second doped region.

In some implementations, a conductivity type of the first doped region is not the same as a conductivity type of the second doped region, and the first doped region and the second doped region are a part of an FD region.

In some implementations, the first active region further includes: a third doped region abutting against the first doped region, where the third doped region is separated from the second doped region, and a conductivity type of the third doped region is not the same as the conductivity type of the first doped region.

In some implementations, the semiconductor structure further includes: a first gate structure located on the first active region and above a portion at which the first doped region abuts against the third doped region; and a spacer at a side surface of the first gate structure, where in forming a semiconductor layer on an upper surface of the second doped region, the spacer separates the semiconductor layer and the first gate structure.

In some implementations, the method further includes, before the contact is formed, forming a barrier layer on a part of the semiconductor layer, the first gate structure, the spacer, and the first active region; wherein forming a contact connected to the semiconductor layer includes: etching the barrier layer to form an opening exposing a part of the semiconductor layer; and forming, in the opening, the contact connected to the semiconductor layer.

In some implementations, the first active region further includes: a fourth doped region abutting against the third doped region, where the fourth doped region is separated from the first doped region, a conductivity type of the fourth doped region is contrary to the conductivity type of the third doped region, and a part of the fourth doped region is located below the first gate structure.

In some implementations, the semiconductor structure further includes: a second active region located on the semiconductor substrate and separated from the first active region, a second gate structure located on the second active region, a first source electrode and a first drain electrode in the second active region and located at two sides of the second gate structure, a third active region located on the semiconductor substrate and separated from the second active region, a third gate structure located on the third active region, and a second source electrode and a second drain electrode in the third active region and located at two sides of the third gate structure.

Forms of the foregoing manufacturing method enables a contact to be formed on a semiconductor layer that is not in direct contact with active regions. In this way, defects caused when forming the contact are kept away from a junction field formed by a second doped region and a first doped region.

Therefore, leakage current may be reduced and device performances may be improved.

In another aspect of the present disclosure, an image sensor is provided, including: a semiconductor substrate; a first active region located on the semiconductor substrate, the first active region including a first doped region and a second doped region abutting against the first active region, and the second doped region being located at an upper surface of the first active region; a semiconductor layer on the second doped region; and a contact on the semiconductor layer.

In some implementations, the semiconductor layer is a doped semiconductor layer.

In some implementations, a conductivity type of the semiconductor layer is the same as to a conductivity type of the second doped region.

In some implementations, material of the semiconductor layer includes polysilicon.

In some implementations, a conductivity type of the first doped region is not the same as the conductivity type of the second doped region, and the first doped region and the second doped region are a part of an FD region.

In some implementations, the first active region further includes: a third doped region abutting against the first doped region, where the third doped region is separated from the second doped region, and a conductivity type of the third doped region is not the same as the conductivity type of the first doped region.

In some implementations, the image sensor further includes: a first gate structure located on the first active region and above a portion at which the first doped region abuts against the third doped region; and a spacer at a side surface of the first gate structure, the spacer separating the semiconductor layer and the first gate structure.

In some implementations, the image sensor further includes: a barrier layer covering a part of the semiconductor layer, the first gate structure, the spacer, and the first active region, where the contact passes through the barrier layer so as to be connected to the semiconductor layer.

In some implementations, the first active region further includes: a fourth doped region abutting against the third doped region, where the fourth doped region is separated from the first doped region, a conductivity type of the fourth doped region is not the same as the conductivity type of the third doped region, and a part of the fourth doped region is located below the first gate structure.

In some implementations, the image sensor further includes: a second active region located on the semiconductor substrate and separated from the first active region, a second gate structure located on the second active region, a first source electrode and a first drain electrode in the second active region and located at two sides of the second gate structure, a third active region located on the semiconductor substrate and separated from the second active region, a third gate structure located on the third active region, and a second source electrode and a second drain electrode in the third active region and located at two sides of the third gate structure.

By forming a contact on a semiconductor layer, defects caused when forming the contact may be kept away from a junction field formed by a second doped region and a first doped region. Therefore, leakage current may be reduced and device performances may be improved.

In the following detailed descriptions of embodiments and forms of the present disclosure with reference to the accompanying drawings, other characters and advantages of the present disclosure will become clear.

BRIEF DESCRIPTION OF THE DRAWINGS

Accompanying drawings, which form a part of the description, describe the embodiments and forms of the present disclosure, and are used to explain the principles of the present disclosure together with the specification.

With reference to the accompanying drawings, the present disclosure may be understood more clearly according to the following detailed description, where.

DETAILED DESCRIPTION

Embodiments and forms of the present disclosure are described in detail for illustration purposes with reference to the accompanying drawings. It should be noted that unless being described in detail, relative layouts, mathematical expressions, and numeric values of components and steps described in these embodiments do not limit the scope of the present disclosure.

Meanwhile, it should be understood that for ease of description, sizes of the parts shown in the accompanying drawings are not drawn according to an actual proportional relationship.

The following description about at least one embodiment or form is for illustration purposes only, and should not be used as any limitation on the present disclosure and applications or uses of the present disclosure.

Technologies, methods, and devices that are known by a person of ordinary skill in the related fields may not be discussed in detail. However, in proper cases, the technologies, methods, and devices should be considered as a part of the authorized description.

In all examples shown and discussed herein, any specific value is provided for illustration purposes only rather than as a limitation. Therefore, other examples of the embodiments for illustration purposes may have different values.

It should be noted that similar reference signs and letters represent similar items in the following accompanying drawings. Therefore, once an item is defined in a figure, the item needs not to be further discussed in the subsequent figures.

Figure 1A:
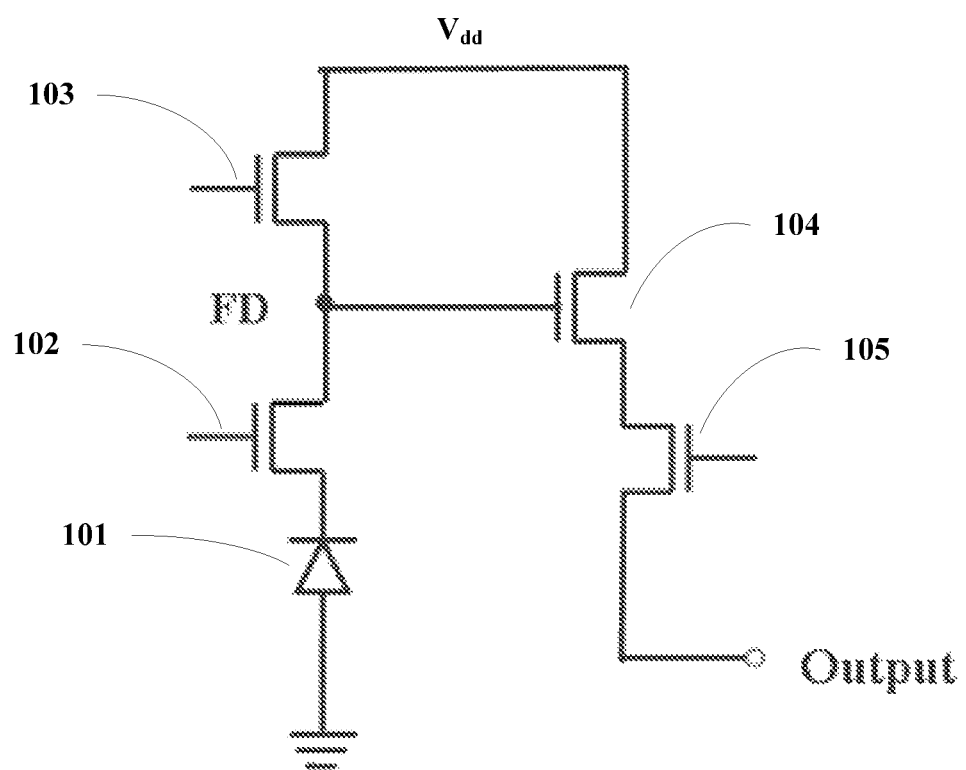
FIG. 1A is a circuit connection diagram that schematically illustrates a CIS in the art.
Figure 1B:
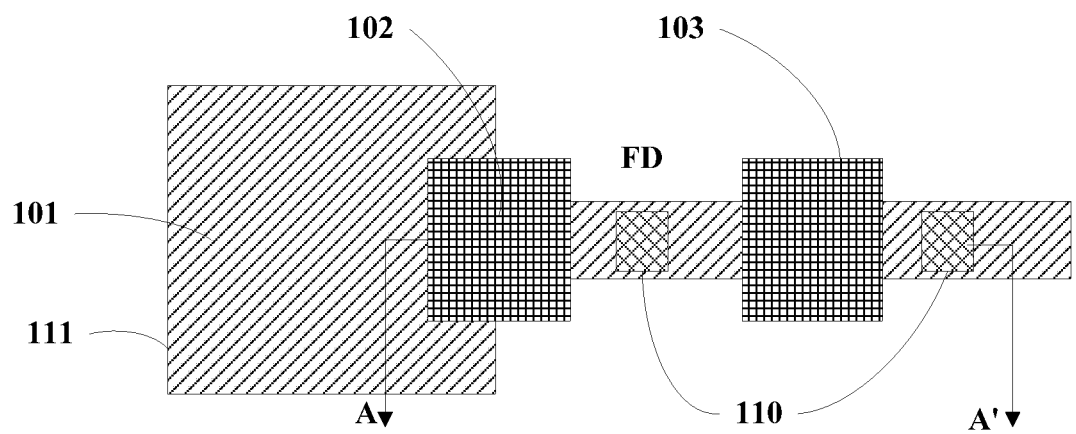
FIG. 1B is a top view that schematically illustrates a part of a circuit structure of a CIS.
Figure 1C:
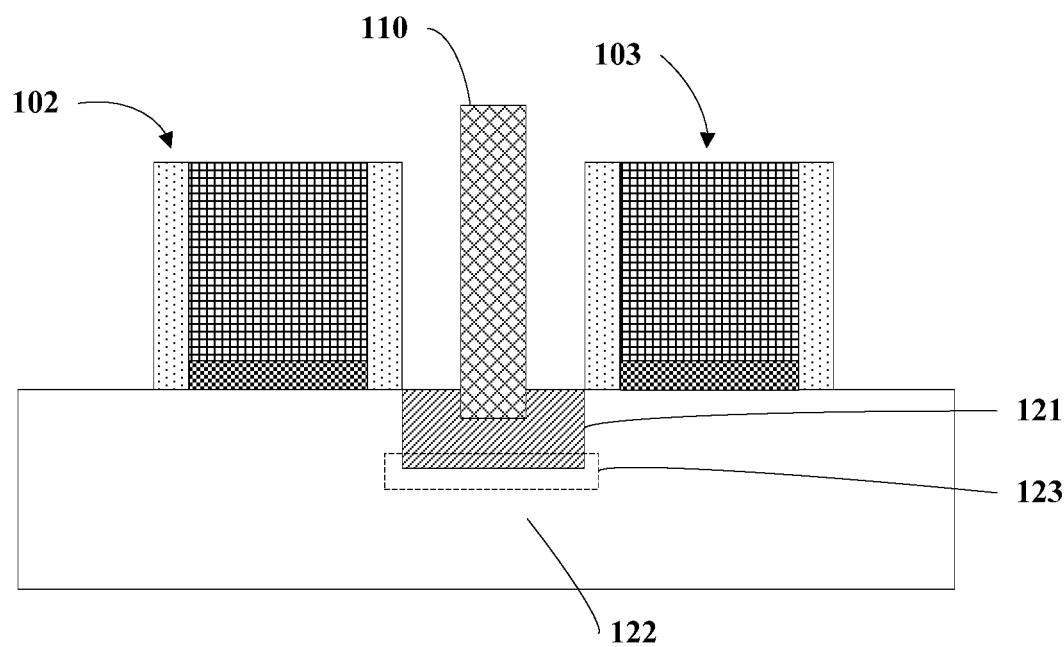
FIG. 1C is a schematic sectional diagram that schematically illustrates a structure in FIG. 1B that is intercepted along a line A-A'.

As shown in FIG. 1C, in a first case, an N/P junction field formed by an N-type doped region 121 and a P-type well region 122 may affect leakage current. For example, greater area and perimeter of the N/P junction may bring in more leakage current. In another case, when forming a metal contact 110 through the etching process, the etching may cause lattice defects to silicon below the metal contact 110, thereby also generating the leakage current. However, leakage current of FD may bring in pixel noise, for example, including FPN (fix pattern noise) and flashing pixels in a final image.

Figures 2, 3:
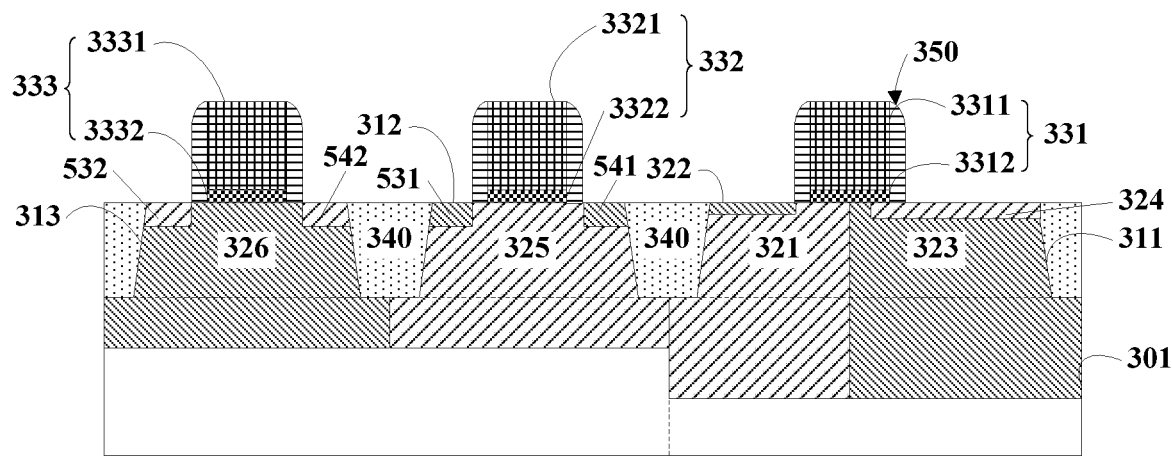
FIG. 2 is a flowchart of a method for manufacturing an image sensor.
FIG. 3 to FIG. 12 are schematic sectional diagrams that schematically illustrate a structure at a plurality of phases of a manufacturing process of an image sensor.

FIG. 2 is a flowchart of a method for manufacturing an image sensor.

In step S201, a semiconductor structure is provided, where the semiconductor structure includes: a semiconductor substrate, and a first active region located on the semiconductor substrate, the first active region including a first doped region and a second doped region abutting against the first active region, and the second doped region being located at an upper surface of the first active region. For example, an upper surface of the second doped region is a part of the upper surface of the first active region.

In some implementations, a conductivity type of the first doped region is contrary to a conductivity type of the second doped region. The first doped region and the second doped region may be a part of a floating diffusion region. For example, the second doped region and the first doped region may form a junction field, for example, forming an N-P junction field.

In step S202, a semiconductor layer is formed on the upper surface of the second doped region. For example, the semiconductor layer may be a doped semiconductor layer. For example, a conductivity type of the semiconductor layer is that same as the conductivity type of the second doped region. Material of the semiconductor layer, for example, may include polysilicon.

In some implementations, before forming the semiconductor layer, the manufacturing method may further include: forming a patterned protection layer on the semiconductor structure, the protection layer exposing the upper surface of the second doped region. For example, material of the protection layer may include: an oxide of silicon and/or a nitride of silicon, or other materials. Or, the protection layer may be another multilayer film having high selectivity to etching. Subsequently, after the patterned protection layer is formed, the semiconductor layer is formed on an exposed upper surface of the second doped region. In some implementations, the manufacturing method may further include: after the semiconductor layer is formed, removing the protection layer.

In some implementations, the step of forming the patterned protection layer may include: forming the protection layer on the semiconductor structure; and etching the protection layer to remove a part of the protection layer which is on the second doped region.

In some implementations, the step of the etching the protection layer to remove a part of the protection layer which is on the second doped region may include: forming a patterned first mask layer on the protection layer, the first mask layer exposing a part of the protection layer which is on the second doped region; removing the exposed part of the protection layer by using the etching process; and removing the first mask layer.

In some implementations, the step S202 may include: forming the semiconductor layer on the semiconductor structure; and etching the semiconductor layer to remove a part of the semiconductor layer, while retaining a part of the semiconductor layer which is on the second doped region.

In some implementations, the step of the etching the semiconductor layer to remove a part of the semiconductor layer may include: forming a patterned second mask layer on the semiconductor layer, the second mask layer covering a part of the semiconductor layer which is on the second doped region; removing a part of the semiconductor layer which is not covered by the second mask layer by using the etching process; and removing the second mask layer.

In step S203, a contact is formed that is connected to the semiconductor layer.

The foregoing manufacturing method enables a contact to be formed on a semiconductor layer and not in direct contact with active regions. In this way, the active regions would not be directly damaged, damages to the active regions caused by etching the contact are reduced in the traditional process, and defects or damages caused when forming the contact are kept away from a junction field formed by a second doped region and a first doped region. Therefore, leakage current may be reduced, and device performances may be improved.

In some implementations, the foregoing manufacturing method may be executed after transistors of a logic circuit are formed. For example, the foregoing manufacturing method is executed after source electrodes and drain electrodes of the transistors of the logic circuit are formed and the source electrodes and the drain electrodes are annealed. Therefore, the foregoing manufacturing method would not affect performances of other devices (such as transistors of the logic circuit).

In some implementations, after the foregoing contact is formed, Back End Of Line (BEOL for short) may be performed using the prior art.

FIG. 3 to FIG. 12 are schematic sectional diagrams that schematically illustrate a structure at a plurality of phases of one form of a manufacturing process of an image sensor. One form of a manufacturing process of an image sensor is described below in detail with reference to FIG. 3 to FIG. 12.

First, as shown in FIG. 3, a semiconductor structure is provided. The semiconductor structure may include a semiconductor substrate 301. For example, the semiconductor substrate 301 may be a silicon substrate or a substrate made of other materials. It should be noted that the dotted lines shown in FIG. 3 only are boundary lines that schematically describe different structures. Actually, these dotted lines do not necessarily exist, and other accompany drawing are similar.

As shown in FIG. 3, the semiconductor structure may further include: a first active region 311 located on the semiconductor substrate 301. The first active region 311 may include: a first doped region 321 and a second doped region 322 abutting against the first doped region 321. The second doped region 322 is located at an upper surface of the first active region 311. For example, an upper surface of the second doped region 322 is a part of the upper surface of the first active region 311. For example, the first doped region 321 and the second doped region 322 may be a part of an FD. In the present invention, the first doped region 321 abutting against the second doped region 322 indicates that the first doped region 321 and the second doped region 322 at least are in up-and-down contact along a vertical direction. In this embodiment, the first doped region 321 and the second doped region 322 are also in left-and-right contact along a horizontal direction.

In some implementations, a conductivity type of the first doped region 321 is contrary to a conductivity type of the second doped region 322. For example, the conductivity type of the first doped region 321 is P-typed, and the conductivity type of the second doped region 322 is N-typed; or the conductivity type of the first doped region 321 is N-typed, and the conductivity type of the second doped region 322 is P-typed. The second doped region and the first doped region may form a junction field of the FD.

In some implementations, as shown in FIG. 3, the first active region 311 may further include: a third doped region 323 abutting against the first doped region 321. Herein, the first doped region 321 abutting against the third doped region 323 indicates that the first doped region 321 and the third doped region 323 are in left-and-right contact along a horizontal direction. The third doped region 323 is separated from the second doped region 322. A conductivity type of the third doped region 323 is contrary to the conductivity type of the first doped region 321. For example, the conductivity type of the first doped region 321 is P-typed, and the conductivity type of the third doped region 323 is N-typed; or the conductivity type of the first doped region 321 is N-typed, and the conductivity type of the third doped region 323 is P-typed. In an embodiment, as shown in FIG. 3, the first doped region 321 and the third doped region 323 may extend into the semiconductor substrate 301, separately.

In some implementations, as shown in FIG. 3, the semiconductor structure may further include: a first gate structure 331 located on the first active region 311 and above a portion at which the first doped region 321 abuts against the third doped region 323. For example, the first gate structure 331 may include: a first gate insulator layer 3312 located on the first active region 311 and a first gate electrode 3311 on the first gate insulator layer 3312. Material of the first gate insulator layer 3312, for example, may include silicon dioxide. Material of the first gate electrode 3311, for example, may include polysilicon. As shown in FIG. 3, the semiconductor structure may further include: a spacer 350 at a side surface of the first gate structure 331. In the subsequent step of forming the semiconductor layer (would be described in the following), the spacer separates the semiconductor layer and the first gate structure 331.

In some implementations, as shown in FIG. 3, the first active region 311 may further include: a fourth doped region 324 abutting against the third doped region 323. Herein, the third doped region 323 abutting against the fourth doped region 324 indicates that the fourth doped region 324 and the third doped region 323 are in up-and-down contact along a vertical direction and are also in left-and-right contact along a horizontal direction. The fourth doped region 324 is separated from the first doped region 321. A conductivity type of the fourth doped region 324 is contrary to the conductivity type of the third doped region 323. For example, the conductivity type of the third doped region 323 may be N-typed, and the conductivity type of the fourth doped region 324 may be P-typed. A PN junction of a photodiode may be formed by the fourth doped region 324 and the third doped region 323. A part of the fourth doped region 324 is located below the first gate structure 331.

In some implementations, as shown in FIG. 3, the semiconductor structure may further include: a second active region 312 located on the semiconductor substrate 301 and separated from the first active region 311. For example, a trench isolation portion 340 may be used to separate the second active region 312 and the first active region 311. The trench isolation portion 340 may include a trench formed around the active regions and an insulator layer (for example, silicon dioxide) filling the trench. The second active region 312 may include a fifth doped region 325. The fifth doped region 325 may extend into the semiconductor substrate 301. For example, the conductivity type of the fifth doped region 325 is the same as the conductivity type of the first doped region 321.

In some implementations, as shown in FIG. 3, the semiconductor structure may further include: a second gate structure 332 located on the second active region 312. For example, the second gate structure 332 may include: a second gate insulator layer 3322 located on the second active region 312 and a second gate electrode 3321 on the second gate insulator layer 3322. Material of the second gate insulator layer 3322, for example, may include silicon dioxide. Material of the second gate electrode 3321, for example, may include polysilicon.

In some implementations, as shown in FIG. 3, the semiconductor structure may further include: a first source electrode 531 and a first drain electrode 541 in the second active region 312 and located at two sides of the second gate structure 332. The first source electrode 531 and the first drain electrode 541 abut against the fifth doped region 325, separately. That is, the first source electrode 531 and the first drain electrode 541 are in contact with the fifth doped region 325 in a horizontal direction, and are also in contact with the fifth doped region 325 in a vertical direction.

In some implementations, as shown in FIG. 3, the semiconductor structure may further include: a third active region 313 located on the semiconductor substrate 301 and separated from the second active region 312. The third active region 313 and the second active region 312 may be separated by the trench isolation portion 340. The third active region 313 may include a sixth doped region 326. The sixth doped region 326 may extend into the semiconductor substrate 301. For example, a conductivity type of the sixth doped region 326 is contrary to the conductivity type of the fifth doped region 325.

In some implementations, as shown in FIG. 3, the semiconductor structure may further include: a third gate structure 333 located on the third active region 313. For example, the third gate structure 333 may include: a third gate insulator layer 3332 located on the third active region 313 and a third gate electrode 3331 on the third gate insulator layer 3332. Material of the third gate insulator layer 3332, for example, may include silicon dioxide. Material of the third gate electrode 3331, for example, may include polysilicon.

In some implementations, as shown in FIG. 3, the spacer 350 may also be formed at side surfaces of the second gate structure 332 and the third gate structure 333.

In some implementations, as shown in FIG. 3, the semiconductor structure may further include: a second source electrode 532 and a second drain electrode 542 in the third active region 313 and located at two sides of the third gate structure 333. The second source electrode 532 and the second drain electrode 542 abut against the sixth doped region 326, separately. That is, the second source electrode 532 and the second drain electrode 542 are in contact with the sixth doped region 326 in a horizontal direction, and are also in contact with the sixth doped region 326 in a vertical direction.

In some implementations, the transistor formed by the second active region and the second gate structure and the transistor formed by the third active region and the third gate structure may be transistors for forming a logic circuit.

It should be noted that in describing the concepts of the present disclosure, some details generally known in the art are not shown in FIG. 3. However, in light of the foregoing description, a person skilled in the art may completely understand how to implement the technical solutions disclosed herein.

In addition, it should be noted that the active regions (for example, the first active region, the second active region, and the third active region) referred in the present disclosure may be active regions of a planar-type device, and may also be active regions of a fin-type device. Therefore, the scope of the present disclosure is not limited hereto.

Figure 4:
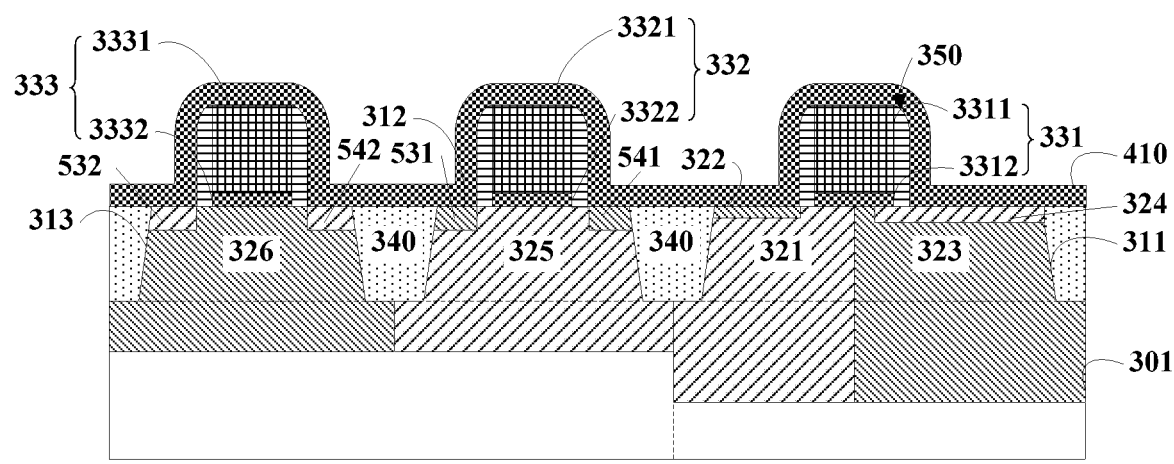

Subsequently, as shown in FIG. 4, for example, a protection layer 410 is formed on the semiconductor structure shown in FIG. 3 using the deposition process. For example, material of the protection layer 410 may include: an oxide of silicon and/or a nitride of silicon.

Figure 5:
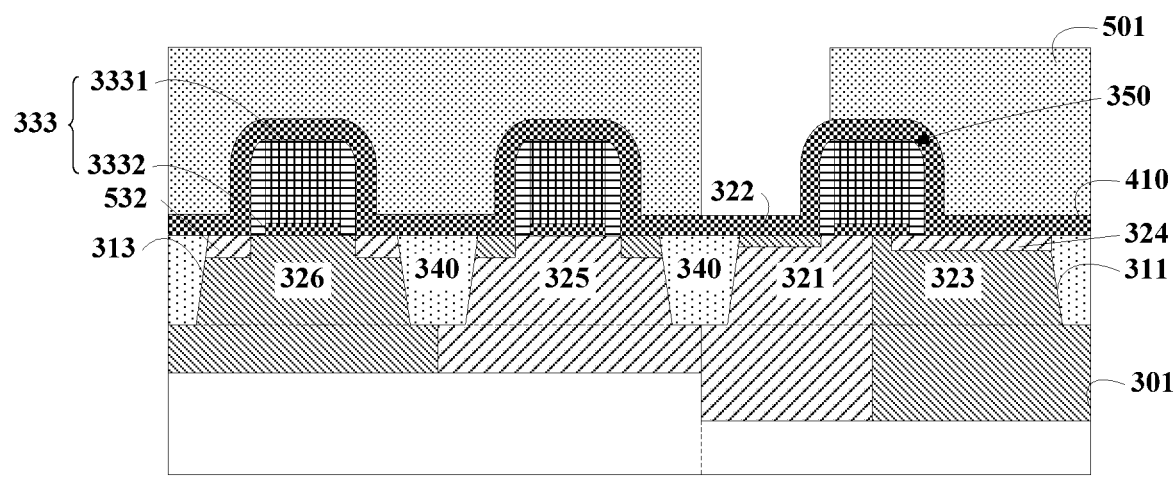

Subsequently, as shown in FIG. 5, for example, a patterned first mask layer (such as photoresist) 501 is formed on the protection layer 410 using the photoetching process, where the first mask layer 501 exposes a part of the protection layer 410 which is on the second doped region 322.

Figure 6:
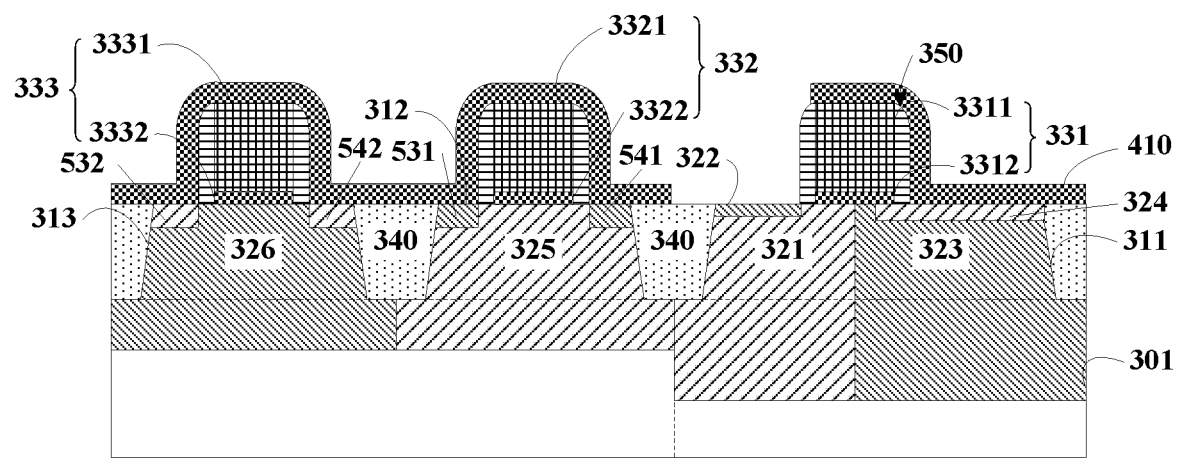

Subsequently, as shown in FIG. 6, the exposed part of the protection layer 410 is removed by using the etching process, and then the first mask layer 501 is removed.

Figure 7:
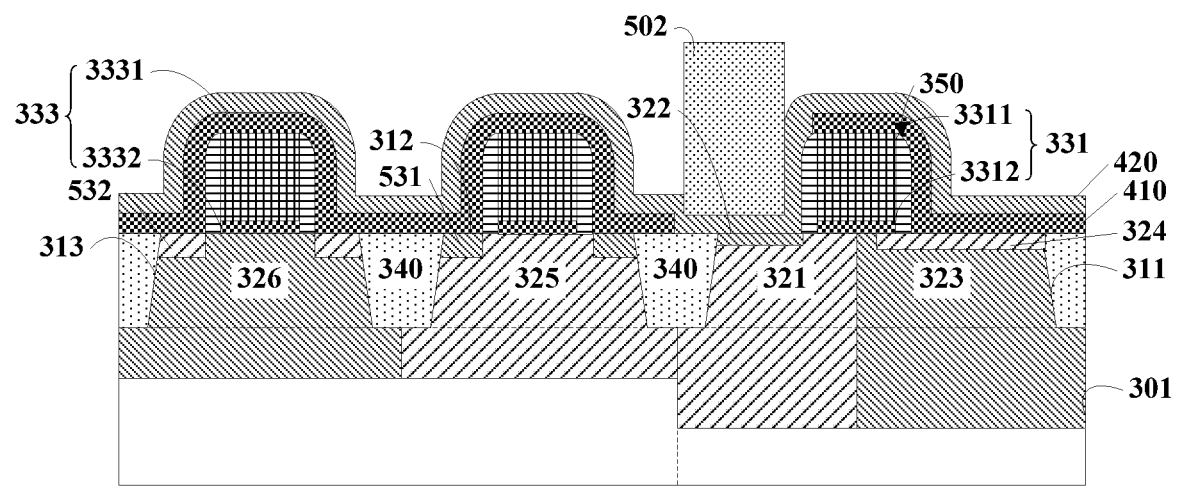

Subsequently, as shown in FIG. 7, for example, a semiconductor layer 420 is formed on the semiconductor structure on which the protection layer 410 is formed by using the deposition process. The semiconductor layer 420 may be a doped semiconductor layer. For example, a conductivity type of the semiconductor layer 420 is the same as the conductivity type of the second doped region 322. Subsequently, as shown in FIG. 7, for example, a patterned second mask layer (such as photoresist) 502 is formed on the semiconductor layer 420 using the photoetching process, where the second mask layer 502 covers a part of the semiconductor layer 420 which is on the second doped region 322, i.e., covering the active regions of the FD. In an embodiment, the second mask layer 502 may cover a part of the trench isolation portion 340, so that remaining semiconductor layer 420 can completely cover the active regions of the FD after a part of the semiconductor layer 420 is removed in the subsequent.

Figure 8:
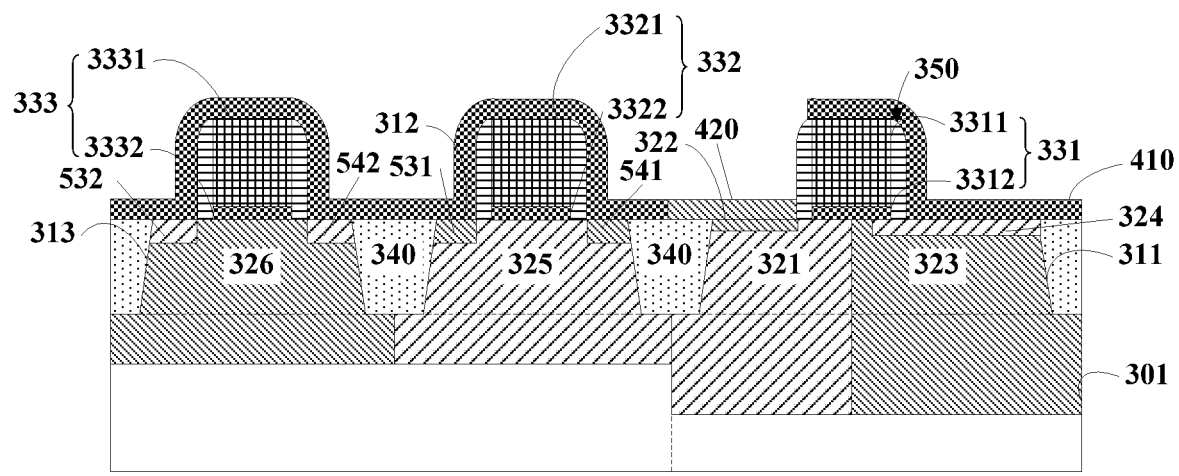

Subsequently, as shown in FIG. 8, a part of the semiconductor layer 420 which is not covered by the second mask layer 502 is removed by using the etching process, thereby patterning the semiconductor layer. Subsequently, the second mask layer 502 is removed. In this step, the spacer 350 separates the patterned semiconductor layer 420 and the first gate structure 331. In some implementations, as shown in FIG. 8, the patterned semiconductor layer abuts against the spacer 350. In some implementation, the patterned semiconductor layer may also be separated from the spacer 350.

Figure 9:
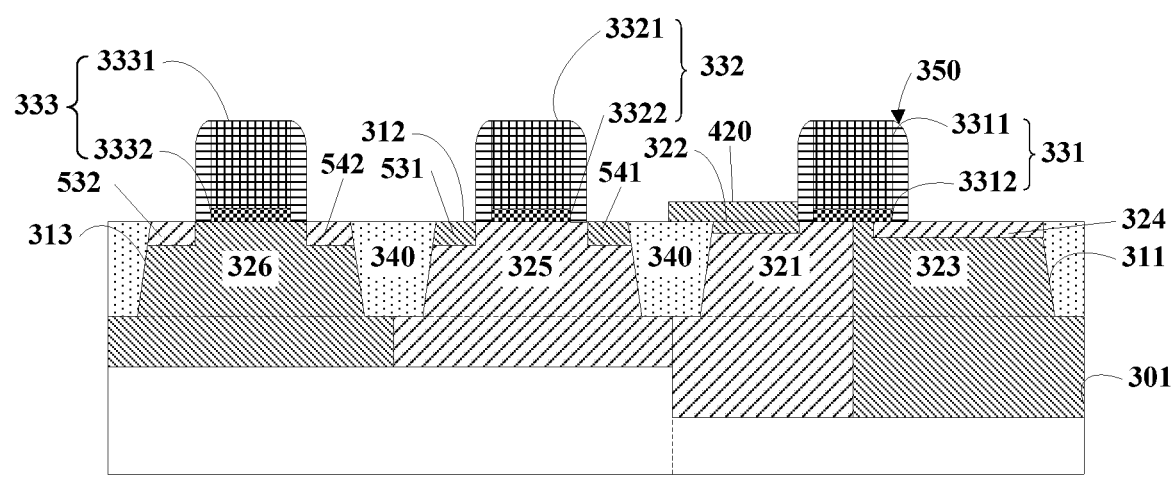

Subsequently, as shown in FIG. 9, the protection layer 410 is removed. For example, the remaining protection layer 410 may be removed according to a selective etching method.

Figure 10:
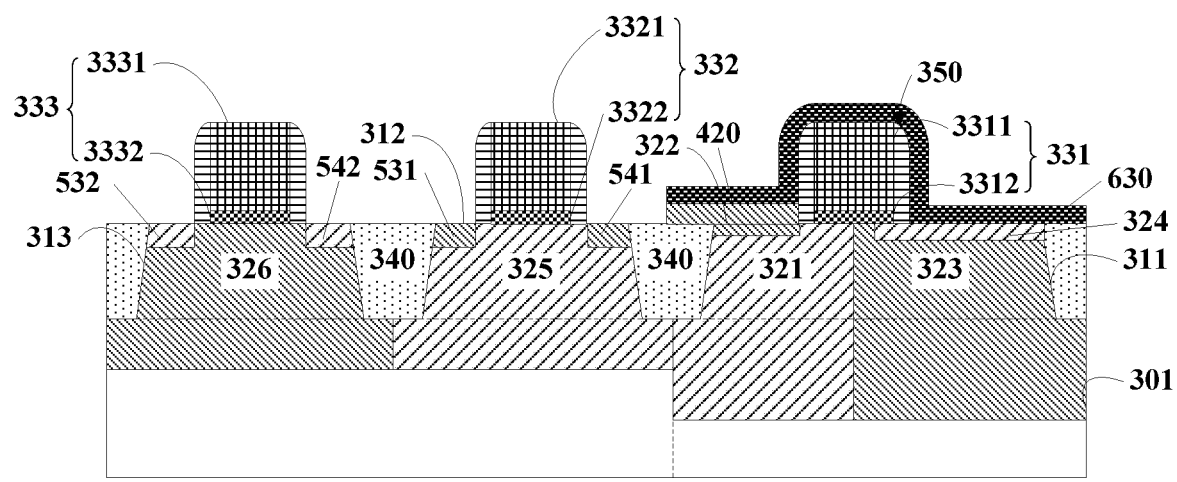

Subsequently, in some implementations, as shown in FIG. 10, after the protection layer 410 is removed and before the contact (would be described in the following) is formed, the manufacturing method may further include: forming a barrier layer 630 on a part of the semiconductor layer 420, the first gate structure 331, the spacer 350, and the first active region 311. For example, the barrier layer 630 may be an SAB (salicide block region). The barrier layer may be used to protect a device surface.

Subsequently, the contact connected to the semiconductor layer 420 is formed.

Figure 11:
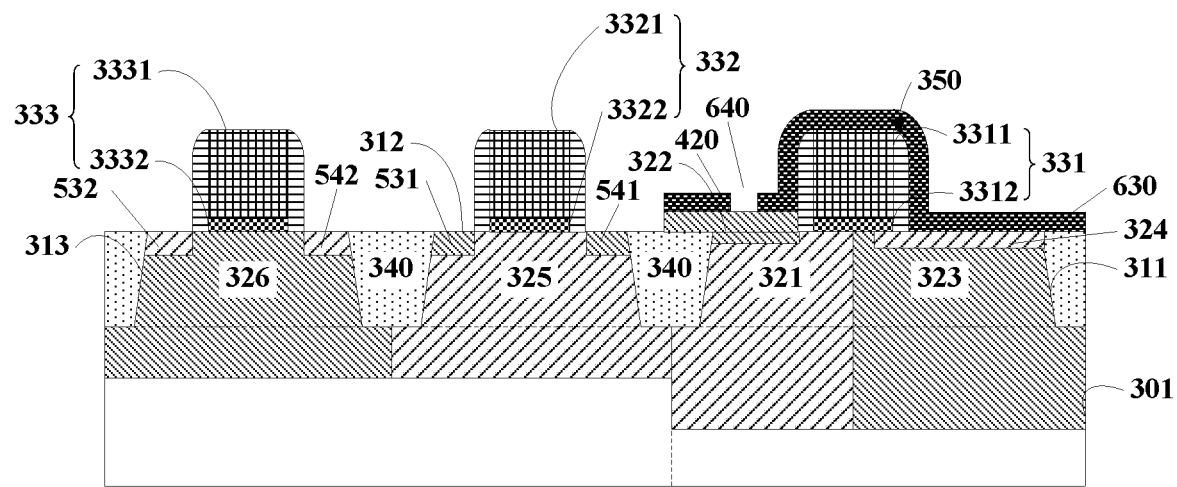
Figure 12:
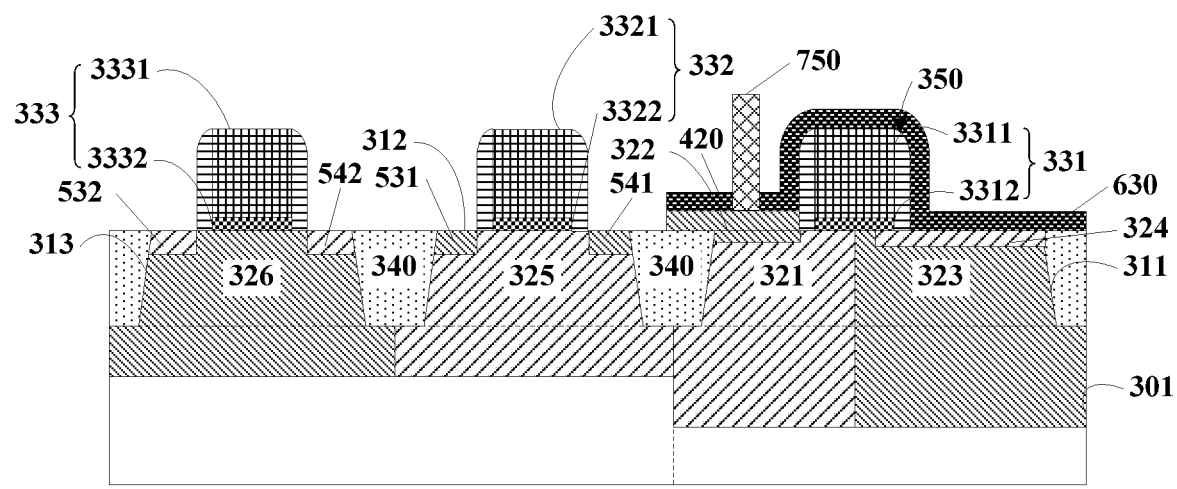

The step of forming the contact may be described with reference to FIG. 11 and FIG. 12. For example, the step of the forming the contact may include: as shown in FIG. 11, etching the barrier layer 630 to form an opening 640 exposing a part of the semiconductor layer 420. Subsequently, the step of the forming the contact may further include: as shown in FIG. 12, forming, through the opening 640, a contact 750 connected to the semiconductor layer 420. For example, material of the contact 750 may include metals such as: copper, aluminum, or tungsten.

Heretofore, one form of a method for manufacturing an image sensor is provided. Through the foregoing manufacturing method, a semiconductor layer is formed on a junction field formed by a second doped region and a first doped region, and then a contact is formed on the semiconductor layer. In this way, defects or damages caused when forming the contact are kept away from the junction field. Therefore, leakage current may be reduced and device performances may be improved.

The present disclosure further provides an image sensor. An image sensor according to an embodiment of the present invention is described below in detail with reference to FIG. 12.

As shown in FIG. 12, the image sensor may include: a semiconductor substrate 301. For example, the semiconductor substrate 301 may be a silicon substrate or a substrate made of other materials.

As shown in FIG. 12, the image sensor may further include: a first active region 311 located on the semiconductor substrate 301. The first active region 311 may include: a first doped region 321 and a second doped region 322 abutting against the first doped region 321. The second doped region 322 is located at an upper surface of the first active region 311. For example, an upper surface of the second doped region 322 is a part of the upper surface of the first active region 311.

In some implementations, a conductivity type of the first doped region 321 is contrary to a conductivity type of the second doped region 322. For example, the conductivity type of the first doped region 321 is P-typed, and the conductivity type of the second doped region 322 is N-typed; or the conductivity type of the first doped region 321 is N-typed, and the conductivity type of the second doped region 322 is P-typed. The first doped region 321 and the second doped region 322 are a part of a floating diffusion region. For example, the second doped region and the first doped region may form a junction field of the FD.

As shown in FIG. 12, the image sensor may further include: a semiconductor layer 420 located on the second doped region 322. For example, the semiconductor layer 420 may be a doped semiconductor layer. For example, a conductivity type of the semiconductor layer 420 is the same as the conductivity type of the second doped region 322. Material of the semiconductor layer, for example, may include polysilicon.

As shown in FIG. 12, the image sensor may further include: a contact 750 on the semiconductor layer 420. For example, material of the contact 750 may include metals such as: copper, aluminum, or tungsten.

By forming a contact on a semiconductor layer, damages to the active regions caused by etching the contact are reduced in the traditional process, and defects or damages caused when forming the contact are kept away from a junction field formed by a second doped region and a first doped region. Therefore, leakage current may be reduced, and device performances may be improved.

In some implementations, the first active region 311 may further include: a third doped region 323 abutting against the first doped region 321. The third doped region 323 is separated from the second doped region 322. A conductivity type of the third doped region 323 is contrary to the conductivity type of the first doped region 321. For example, the conductivity type of the first doped region 321 is P-typed, and the conductivity type of the third doped region 323 is N-typed; or the conductivity type of the first doped region 321 is N-typed, and the conductivity type of the third doped region 323 is P-typed. In an embodiment, the first doped region 321 and the third doped region 323 may extend into the semiconductor substrate 301, separately.

In some implementations, as shown in FIG. 12, the image sensor may further include: a first gate structure 331 located on the first active region 311 and above a portion at which the first doped region 321 abuts against the third doped region 323. For example, the first gate structure 331 may include: a first gate insulator layer 3312 located on the first active region 311 and a first gate electrode 3311 on the first gate insulator layer 3312. Material of the first gate insulator layer 3312, for example, may include silicon dioxide. Material of the first gate electrode 3311, for example, may include polysilicon.

In some implementations, as shown in FIG. 12, the image sensor may further include: a spacer 350 at a side surface of the first gate structure 331. The spacer 350 separates the semiconductor layer 420 and the first gate structure 331.

In some implementations, as shown in FIG. 12, the image sensor may further include: a barrier layer 630 covering a part of the semiconductor layer 420, the first gate structure 331, the spacer 350, and the first active region 311. The contact 750 passes through the barrier layer 630 so as to be connected to the semiconductor layer 420. For example, the barrier layer 630 may be an SAB. The barrier layer may be used to protect a device surface.

In some implementations, as shown in FIG. 12, the first active region 311 may further include: a fourth doped region 324 abutting against the third doped region 323. The fourth doped region 324 is separated from the first doped region 321. A conductivity type of the fourth doped region 324 is contrary to the conductivity type of the third doped region 323. For example, the conductivity type of the third doped region 323 may be N-typed, and the conductivity type of the fourth doped region 324 may be P-typed. A PN junction of a photodiode may be formed by the fourth doped region 324 and the third doped region 323. A part of the fourth doped region 324 is located below the first gate structure 331.

In some implementations, as shown in FIG. 12, the image sensor may further include: a second active region 312 located on the semiconductor substrate 301 and separated from the first active region 311. For example, a trench isolation portion 340 may be used to separate the second active region 312 and the first active region 311. The trench isolation portion 340 may include a trench formed around the active regions and an insulator layer (for example, silicon dioxide) filling the trench. The second active region 312 may include a fifth doped region 325. The fifth doped region 325 may extend into the semiconductor substrate 301. For example, the conductivity type of the fifth doped region 325 is same to the conductivity type of the first doped region 321.

In some implementations, as shown in FIG. 12, the image sensor may further include: a second gate structure 332 located on the second active region 312. For example, the second gate structure 332 may include: a second gate insulator layer 3322 located on the second active region 312 and a second gate electrode 3321 on the second gate insulator layer 3322. Material of the second gate insulator layer 3322, for example, may include silicon dioxide. Material of the second gate electrode 3321, for example, may include polysilicon.

In some implementations, as shown in FIG. 12, the image sensor may further include: a first source electrode 531 and a first drain electrode 541 in the second active region 312 and located at two sides of the second gate structure 332. The first source electrode 531 and the first drain electrode 541 abut against the fifth doped region 325, separately.

In some implementations, as shown in FIG. 12, the image sensor may further include: a third active region 313 located on the semiconductor substrate 301 and separated from the second active region 312. The third active region 313 and the second active region 312 may be separated by the trench isolation portion 340. The third active region 313 may include a sixth doped region 326. The sixth doped region 326 may extend into the semiconductor substrate 301. For example, a conductivity type of the sixth doped region 326 is contrary to the conductivity type of the fifth doped region 325.

In some implementations, as shown in FIG. 12, the image sensor may further include: a third gate structure 333 located on the third active region 313. For example, the third gate structure 333 may include: a third gate insulator layer 3332 located on the third active region 313 and a third gate electrode 3331 on the third gate insulator layer 3332. Material of the third gate insulator layer 3332, for example, may include silicon dioxide. Material of the third gate electrode 3331, for example, may include polysilicon.

In some implementations, as shown in FIG. 12, the spacer 350 may also be formed at side surfaces of the second gate structure 332 and the third gate structure 333.

In some implementations, as shown in FIG. 12, the image sensor may further include: a second source electrode 532 and a second drain electrode 542 in the third active region 313 and located at two sides of the third gate structure 333. The second source electrode 532 and the second drain electrode 542 abut against the sixth doped region 326, separately.

In some implementations, the transistor formed by the second active region and the second gate structure and the transistor formed by the third active region and the third gate structure may be transistors for forming a logic circuit.

Above, the present disclosure is described in detail. In describing the concepts of the present disclosure, some details generally known in the art are not described. According to the foregoing description, a person skilled in the art may completely understand how to implement the technical solutions disclosed herein.

Some specific embodiments and forms of the present disclosure are described in detail through examples. However, a person skilled in the art should understand that the foregoing examples are merely for description, but are not intended to limit the scope of the present disclosure. A person skilled in the art should understand that the foregoing embodiments and forms may be modified without departing from the scope and spirit of the present disclosure. The scope of the present disclosure is defined by the appended claims.

What is claimed is:

1. A method for manufacturing an image sensor, comprising:
    providing a semiconductor structure, wherein the semiconductor structure comprises: a semiconductor substrate, and a first active region located on the semiconductor substrate, the first active region comprising a first doped region, a second doped region abutting against the first doped region, a third doped region abutting against the first doped region, and a fourth doped region abutting against the third doped region, wherein the second doped region is located at an upper surface of the first active region;
    forming a semiconductor layer on an upper surface of the second doped region; and
    forming a contact connected to the semiconductor layer;
    wherein the semiconductor structure further comprises a first gate structure located on the first active region, the first gate structure comprising a first gate electrode located above a portion at which the first doped region abuts against the third doped region, and only a portion of an upper surface of the fourth doped region is located below the first gate electrode.

2. The method according to claim 1, wherein the semiconductor layer is a doped semiconductor layer.

3. The method according to claim 2, wherein a conductivity type of the semiconductor layer and a conductivity type of the second doped region are the same.

4. The method according to claim 1, wherein a material of the semiconductor layer comprises polysilicon.

5. The method according to claim 1, wherein the method further comprises:
 before forming the semiconductor layer, forming a patterned protection layer on the semiconductor structure, the patterned protection layer exposing the upper surface of the second doped region.

6. The method according to claim 5, wherein the method further comprises:
 after the semiconductor layer is formed and before the contact is formed, removing the patterned protection layer.

7. The method according to claim 5, wherein a material of the patterned protection layer includes at least one of an oxide of silicon or a nitride of silicon.

8. The method according to claim 1, wherein forming the semiconductor layer on an upper surface of the second doped region comprises:
 forming the semiconductor layer on the semiconductor structure; and
 etching the semiconductor layer to remove a part of the semiconductor layer while retaining a part of the semiconductor layer which is on the second doped region.

9. The method according to claim 1, wherein a conductivity type of the first doped region is not the same as a conductivity type of the second doped region, and the first doped region and the second doped region are a part of an FD region.

10. The method according to claim 1, wherein the third doped region is separated from the second doped region, and a conductivity type of the third doped region is not the same as the conductivity type of the first doped region.

11. The method according to claim 1, wherein the semiconductor structure further comprises:
 a spacer at a side surface of the first gate structure, wherein in the step of the forming a semiconductor layer on an upper surface of the second doped region, the spacer separates the semiconductor layer and the first gate structure.

12. The method according to claim 11, wherein the method further comprises:
 before the contact is formed, forming a barrier layer on a part of the semiconductor layer, the first gate structure, the spacer, and the first active region; and
 wherein forming a contact connected to the semiconductor layer comprises:
  etching the barrier layer to form an opening exposing a part of the semiconductor layer; and
  forming, in the opening, the contact connected to the semiconductor layer.

13. The method according to claim 1, wherein
 a conductivity type of the fourth doped region is not the same as the conductivity type of the third doped region.

14. The method according to claim 1, wherein the semiconductor structure further comprises:
 a second active region located on the semiconductor substrate and separated from the first active region, a second gate structure located on the second active region, a first source electrode and a first drain electrode in the second active region and located at two sides of the second gate structure,
 a third active region located on the semiconductor substrate and separated from the second active region, a third gate structure located on the third active region, and a second source electrode and a second drain electrode in the third active region and located at two sides of the third gate structure.

* * * * *